United States Patent
Wada et al.

(10) Patent No.: US 11,562,916 B2
(45) Date of Patent: Jan. 24, 2023

(54) MOUNTING APPARATUS AND TEMPERATURE MEASUREMENT METHOD

(71) Applicant: SHINKAWA LTD., Tokyo (JP)

(72) Inventors: Shoji Wada, Tokyo (JP); Hiroshi Kikuchi, Tokyo (JP)

(73) Assignee: SHINKAWA LTD., Tokyo (JP)

(*) Notice: Subject to any disclaimer, the term of this patent is extended or adjusted under 35 U.S.C. 154(b) by 444 days.

(21) Appl. No.: 16/650,381

(22) PCT Filed: Aug. 22, 2018

(86) PCT No.: PCT/JP2018/030986
§ 371 (c)(1),
(2) Date: Jun. 9, 2020

(87) PCT Pub. No.: WO2019/039508
PCT Pub. Date: Feb. 28, 2019

(65) Prior Publication Data
US 2020/0365432 A1 Nov. 19, 2020

(30) Foreign Application Priority Data
Aug. 22, 2017 (JP) .............................. JP2017-159714

(51) Int. Cl.
*H01L 21/67* (2006.01)
*G01N 25/18* (2006.01)

(52) U.S. Cl.
CPC ....... *H01L 21/67248* (2013.01); *G01N 25/18* (2013.01); *H01L 21/67103* (2013.01); *H01L 21/67144* (2013.01)

(58) Field of Classification Search
CPC ......... H01L 21/67248; H01L 21/67103; H01L 21/67144; H01L 2224/75251;
(Continued)

(56) References Cited

U.S. PATENT DOCUMENTS 6,142,356 A * 11/2000 Yamazaki ............... H01L 24/75
228/49.1

FOREIGN PATENT DOCUMENTS

JP H01189526 7/1989
JP H08111385 4/1996
(Continued)

OTHER PUBLICATIONS

"International Search Report (Form PCT/ISA/210) of PCT/JP2018/030986," dated Nov. 20, 2018, with English translation thereof, pp. 1-3.

*Primary Examiner* — Vu A Vu
(74) *Attorney, Agent, or Firm* — JCIPRNET

(57) ABSTRACT

The present invention is provided with: a stage having a placing surface for a semiconductor chip, and a first heater heating the placing surface; a bonding head having a contact surface to be in contact with an subject, a second temperature sensor measuring the temperature of the subject via the contact surface, and a second heater heating the contact surface, said bonding head being driven in at least the orthogonal direction with respect to the placing surface; and a control unit measuring the temperature of the subject based on a temperature detection value of the second temperature sensor, said temperature detection value having being obtained by heating the placing surface and the contact surface to predetermined target temperatures, respectively, by means of the first and second heaters, then bringing the contact surface into contact with the subject in a state wherein heating by the second heater is stopped.

14 Claims, 8 Drawing Sheets

(58) Field of Classification Search
CPC . H01L 2224/75252; H01L 2224/75822; H01L 24/75; H01L 2224/75824; H01L 2224/75901; G01N 25/18
USPC .......................................................... 374/44
See application file for complete search history.

(56) References Cited

FOREIGN PATENT DOCUMENTS

| | | |
|---|---|---|
| JP | H10256298 | 9/1998 |
| JP | H11186338 | 7/1999 |
| JP | 2000036501 | 2/2000 |
| JP | 2016213384 | 12/2016 |

* cited by examiner

MOUNTING APPARATUS AND TEMPERATURE MEASUREMENT METHOD

CROSS-REFERENCE TO RELATED APPLICATION

This application is a 371 application of the international PCT application serial no. PCT/JP2018/030986, filed on Aug. 22, 2018, which claims the priority benefit of Japan applications no. 2017-159714, filed on Aug. 22, 2017. The entirety of each of the above— mentioned patent applications is hereby incorporated by reference herein and made a part of this specification.

BACKGROUND OF THE INVENTION

Technical Field

The present invention relates to a mounting apparatus and a temperature measurement method, with which it is possible to measure the temperature of an object to be measured that is a mounted body or a placing surface on which the mounted body is mounted.

Related Art

Conventionally, a mounting apparatus which mounts a mounting body such as a semiconductor chip on a mounted body such as a substrate is widely known. This mounting apparatus includes a stage on which the mounted body such as a substrate is placed and a bonding head which is movable with respect to the stage. The bonding head holds the semiconductor chip and bonds the semiconductor chip to the mounted body.

The bonding head is usually equipped with a heater inside and the held semiconductor chip can be heated. In addition, the stage is also usually equipped with a heater and the mounted body placed on the stage can be heated to a specified temperature.

Here, desirably, the temperature of the stage surface is maintained at a specified target temperature to appropriately perform mounting processing. If the heating temperature of the stage is inaccurate or there is a variation in the heating temperature at each location of the stage, reduction or variation in the mounting quality is caused.

Therefore, it is conventionally proposed to measure the temperature of the placing surface of the stage or the mounted body such as a substrate placed on the placing surface (hereinafter referred to as "object to be measured"). For example, in patent literature 1, it is disclosed that a temperature measurement part consisting of a thermocouple or the like for measuring the temperature of an upper surface portion of the stage is arranged inside the stage.

LITERATURE OF RELATED ART

Patent Literature

Patent literature 1: Japanese Patent Laid-open No. 11-186338

SUMMARY

Problems to be Solved

However, it is difficult to accurately measure the temperature of the placing surface of the stage or the temperature of the mounted body placed on the placing surface by the temperature measurement part arranged inside the stage. Therefore, it is also conceived to paste the temperature measurement part such as a thermocouple on the surface (the placing surface) of the stage instead of the inside of the stage. However, appropriate mounting processing cannot be performed when the thermocouple or the like is pasted on the placing surface, and thus this thermocouple is required to be removed before the mounting processing and it is troublesome. In addition, as another countermeasure, the utilization of a thermocamera that measures the temperature in a non-contact manner is also conceived, but the thermocamera is very expensive and is not practical.

Furthermore, as another embodiment, it is also conceived to bring a measurement head having a measurement element that measures the temperature into contact with an object to be measured and measure the temperature of the object to be measured. However, when a temperature difference between the measurement head and the object to be measured is large, heat transfers between the two after the measurement head is brought into contact with the object to be measured, and an accurate temperature cannot be measured or it takes time to accurately measure the temperature.

Therefore, this specification discloses a mounting apparatus and a temperature measurement method capable of more accurately measuring the temperature of an object to be measured.

Means to Solve Problems

The mounting apparatus disclosed in the specification mounts a mounting body on a mounted body and includes: a stage having a placing surface on which the mounted body is mounted and a first heater that heats the placing surface; a measurement head which has a contact surface in contact with an object to be measured that is the mounted body or the placing surface, a measurement element that measures the temperature of the object to be measured via the contact surface, and a second heater that heats the contact surface, and which is driven in at least a direction orthogonal to the placing surface; and a control unit which measures the temperature of the object to be measured based on a temperature detection value of the measurement element, the temperature detection value being obtained by respectively heating the placing surface and the contact surface to predetermined target temperatures by means of the first heater and the second heater, and then bringing the contact surface into contact with the object to be measured in a state that the heating by the second heater is stopped.

In this case, the measurement head may be a bonding head which bonds the mounting body to the mounted body.

In addition, the control unit may determine the temperature of the object to be measured or whether the temperature of the object to be measured is appropriate based on a change over time in the temperature detection value of the measurement element obtained when the contact surface is brought into contact with the object to be measured.

In addition, the control unit may correct a control parameter of the first heater based on a measurement result of the temperature of the object to be measured. In this case, a plurality of measurement points may be set on the object to be measured, and the control unit may perform the temperature measurement for the plurality of measurement points and correct the control parameter so that the measurement results are equal among the plurality of measurement points.

In addition, the measurement head may further include a main body, and a measurement block having a smaller heat capacity than the main body and attached to the measurement head via a heat insulating material; the contact surface is an end face of the measurement block; and the measurement element is arranged in the measurement block.

A temperature measurement method disclosed in the specification is a method for measuring the temperature of an object to be measured which is a mounted body placed on a placing surface of a stage of a mounting apparatus or the placing surface of the stage by means of a measurement head, the method including: a step for heating the placing surface and a contact surface of the measurement head in contact with the object to be measured to specified target temperatures by means of a first heater arranged inside the stage and a second heater arranged on the measurement head; a step for bringing the contact surface into contact with the object to be measured in a state that the second heater is stopped after the heating; and a step for measuring the temperature of the object to be measured based on a temperature detection value obtained by a temperature measurement element arranged on the measurement head during the contact.

Effect

According to the mounting apparatus and the temperature measurement method disclosed in the specification, the contact surface is brought into contact with the object to be measured in a preheated state and thus the transfer amount of heat between the object to be measured and the measurement head can be reduced. As a result, the temperature of the object to be measured can be more quickly and accurately measured.

DESCRIPTION OF THE EMBODIMENTS

Figure 1:
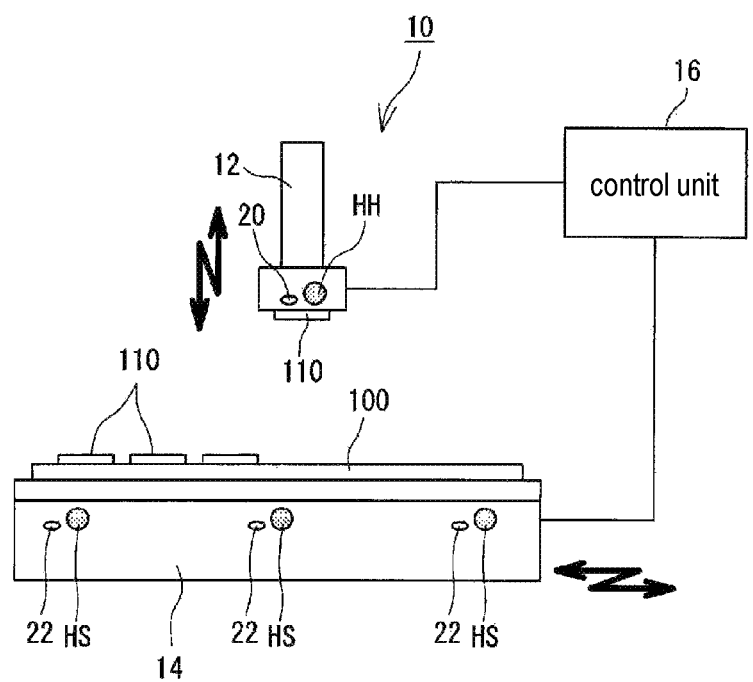
FIG. 1 is a diagram showing a configuration of a mounting apparatus.

Hereinafter, a configuration of a mounting apparatus 10 is described with reference to the drawings. FIG. 1 is a diagram showing a schematic configuration of the mounting apparatus 10. The mounting apparatus 10 is a apparatus which bonds and mounts a semiconductor chip 110 to a mounted body such as a substrate 100. The mounting apparatus 10 includes a stage 14, a bonding head 12 for bonding, and a control unit 16 that controls driving of the stage 14 and the bonding head 12.

The stage 14 is a table on which the mounted body such as the substrate 100 is mounted, and the surface thereof is a placing surface on which the mounted body is placed. The stage 14 can move in the horizontal direction, and the movement is controlled by the control unit 16. In addition, one or more first heaters HS are built in the stage 14. The first heater HS is a pulse heater, but other types of heaters may also be used as long as the heater can raise the temperature in a relatively short time. In addition, the number and the position of the first heaters HS are not particularly limited as long as the surface (the placing surface) of the stage 14 can be heated uniformly.

A first temperature sensor 22 is incorporated in each first heater HS. The first temperature sensor 22 is a sensor that detects the temperature of the first heater HS as a first detection temperature T1 and is, for example, a thermocouple. The control unit 16 controls driving of the first heater HS based on the first detection temperature T1 detected by the first temperature sensor 22.

The bonding head 12 is a head which bonds the mounting body such as the semiconductor chip 110 to the mounting body placed on the placing surface of the stage 14. In addition, as described later, the bonding head 12 also functions as a measurement head for measuring the temperature of the placing surface of the stage 14 or the mounting body mounted on the placing surface (hereinafter collectively referred to as "object to be measured"). The bonding head 12 can hold the semiconductor chip 110 at the lower end of the bonding head 12, and can rotate, ascend and descend around a vertical axis. When bonding the semiconductor chip 110, the bonding head 12 is lowered toward the stage 14 side while holding the semiconductor chip 110 at the lower end thereof, and presses the semiconductor chip 110 against the mounted body. Here, the parallelism of the bonding head 12 with respect to the stage 14 is adjusted with high precision so that the semiconductor chip 110 can be pressurized uniformly.

A second heater HH is arranged inside a front end portion of the bonding head 12. Similar to the first heater HS, the second heater HH is a pulse heater, but other types of heaters may also be used as long as the heater can raise the temperature in a relatively short time. A second temperature sensor 20 is incorporated in the second heater HH. The second temperature sensor 20 is a temperature measurement element that detects the temperature of the second heater HH as a second detection temperature T2 and is, for example, a thermocouple. The control unit 16 controls driving of the second heater HH based on the second detection temperature T2 detected by the second temperature sensor 20. In addition, as described later, the control unit 16 measures the temperature of the object to be measured based on the second detection temperature T2 detected by the second temperature sensor 20 when the bonding head 12 is brought into contact with the object to be measured. Besides, the second heater HH and the second temperature sensor 20 are both arranged near the lower end of the front end surface of the bonding head 12 so that the second detection temperature T2 can reflect the temperature of the lower end surface of the bonding head 12. Besides, the front end surface of the bonding head 12 functions as a contact surface in contact with the object to be measured.

The control unit 16 controls the movement of the bonding head 12 and the stage 14 corresponding to the progress of processing or the like. In addition, the control unit 16 controls the driving (for example, ON/OFF control, applied current value, and the like) of the first heater HS based on the first detection temperature T1, or controls the driving (for example, ON/OFF control, applied current value, and the like) of the second heater HH based on the second detection temperature T2. Furthermore, the control unit 16 also utilizes the second detection temperature T2 to perform temperature measurement of the object to be measured as necessary. Here, the "temperature measurement of the object to be measured" may refer to acquisition of a specific numerical value of the temperature of the object to be measured, or refer to detection on whether the temperature of the object to be measured varies from a prescribed reference temperature (for example, a target temperature Tt or the like).

Figure 2:
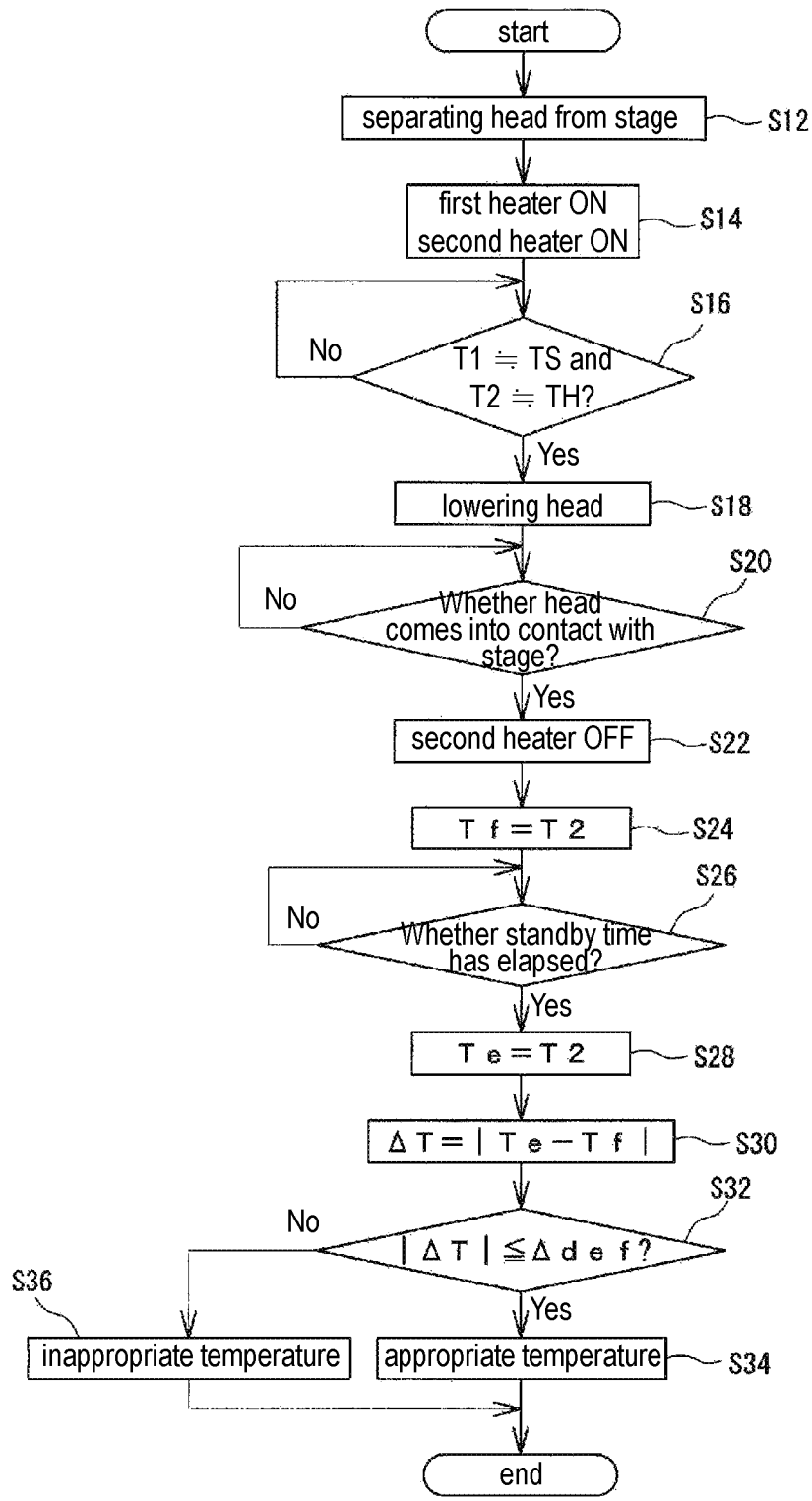
FIG. 2 is a flowchart showing a flow of temperature measurement processing.

Next, a flow of measuring the temperature of the placing surface of the stage 14 which is an object to be measured by means of the mounting apparatus 10 is described. FIG. 2 is a flowchart showing the flow of the temperature measurement processing. In this temperature measurement processing, detection is made on whether the temperature of the placing surface varies from the specified target temperature Tt.

In the temperature measurement processing, first, the control unit 16 raises the bonding head 12 also functioning as a measurement head and separates the bonding head 12 from the stage 14 (S12). In this state, the control unit 16 turns on the first heater HS and the second heater HH (S14), and heats the stage 14 and the bonding head 12. The heating is performed so that the surface (the contact surface) of the bonding head 12 and the surface (the placing surface) of the stage 14 respectively reach the specified target temperature Tt.

Here, the first heater HS and the first temperature sensor 22 are embedded in the stage 14, and the temperature of the placing surface of the stage 14 is slightly lower than the first detection temperature T1 detected by the first temperature sensor 22. Therefore, the first detection temperature T1 to be obtained when the temperature of the placing surface of the stage 14 reaches the target temperature Tt is specified in advance as a stage-side target temperature TS. Then, the control unit 16 controls the energization amount of the first heater HS so that the first detection temperature T1 reaches the stage-side target temperature TS.

Similarly, the second detection temperature T2 to be obtained when the temperature of the lower end surface (the contact surface) of the bonding head 12 reaches the target temperature Tt is specified in advance as a head-side target temperature TH. Then, the control unit 16 controls the energization amount of the second heater HH so that the second detection temperature T2 reaches the head-side target temperature TH. Besides, the second heater HH and the second temperature sensor 20 are arranged near the contact surface of the bonding head 12. Accordingly, usually, the head-side target temperature TH is substantially the same as the target temperature Tt (TH≈Tt). On the other hand, the first heater HS and the first temperature sensor 22 are separated from the placing surface of the stage 14, and thus the stage-side target temperature TS is slightly higher than the target temperature Tt (TS>Tt). For example, in a case that the target temperature Tt=235° C., the head-side target temperature TH can be set to 235° C. and the stage-side target temperature TS can be set to 250° C.

Figure 3:
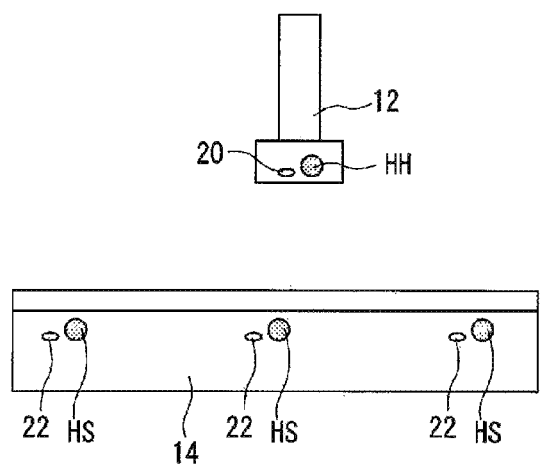
FIG. 3 is an image diagram showing a process of the temperature measurement processing.

FIG. 3 is an image diagram showing a state of the mounting apparatus 10 at this time. In the following drawings, the colors inside the heaters HH, HS indicate an ON/OFF state thereof, wherein gray indicates the ON state, and white indicates the OFF state. As shown in FIG. 3, when the bonding head 12 and the stage 14 are separated from each other, the first heater HS and the second heater HH are both in the ON state.

When the first detection temperature T1 reaches the stage-side target temperature TS and the second detection temperature T2 reaches the head-side target temperature TH (Yes in S16), the control unit 16 lowers the bonding head 12 (S18). If the contact surface of the bonding head 12 comes into contact with the placing surface of the stage 14 as a result of the lowering (Yes in S20), the control unit 16 turns off the second heater HH (S22). In addition, the control unit 16 stores the second detection temperature T2 detected by the second temperature sensor 20 immediately after the contact surface of the bonding head 12 comes into contact with the placing surface of the stage 14 as an initial temperature Tf (S24).

Figure 4:
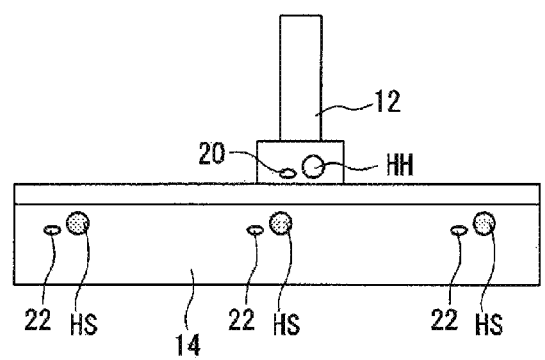
FIG. 4 is an image diagram showing the process of the temperature measurement processing.

FIG. 4 is an image diagram showing a state in which the bonding head 12 is in contact with the stage 14. As shown in FIG. 4, the entire contact surface of the bonding head 12 is in contact with the placing surface of the stage 14. In addition, at this time, the second heater HH is in the OFF state, and the first heater HS is in the ON state.

After that, the control unit 16 stands by for a prescribed standby time is in that state, that is, in the state that the contact surface of the bonding head 12 is in contact with the placing surface of the stage 14, the first heater HS is turned on, and the second heater HH is turned off (S26). Besides, during this standby, the control unit 16 controls the energization amount of the first heater HS so as to maintain the first detection temperature T1=TS.

If the prescribed standby time ts has elapsed (Yes in S26), the control unit 16 stores the second detection temperature T2 detected by the second temperature sensor 20 as an end temperature Te (S28). If the end temperature Te is obtained, the control unit 16 calculates a temperature change amount $\Delta T=Te-Tf$ (S30). Besides, usually, the initial temperature Tf is substantially the same as the head-side target temperature TH. Accordingly, instead of the initial temperature Tf, the head-side target temperature TH may be used to calculate the temperature change amount $\Delta T$, and step S24 may be omitted in this case.

The temperature change amount $\Delta T$ is a value representing the amount of heat flowing into and out of the bonding head 12 after the second heater HH is turned off, and can be considered as a value indicating a temperature difference between the contact surface of the bonding head 12 and the placing surface of the stage 14 (the object to be measured). The control unit 16 determines whether the temperature of the placing surface of the stage 14 is appropriate based on the temperature change amount $\Delta T$.

Figure 5:
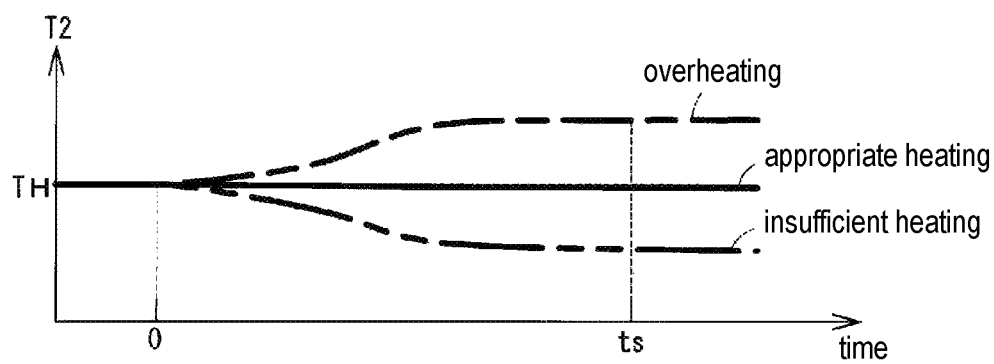
FIG. 5 is an image diagram showing a change over time in a second detection temperature.

The above situation is described with reference to FIG. 5. FIG. 5 is an image diagram illustrating a difference of the temperature change in the second detection temperature T2 caused by a temperature difference of the placing surface of the stage 14. In FIG. 5, the horizontal axis represents time, and the vertical axis represents the second detection temperature T2. In FIG. 5, time 0 represents a timing at which the contact surface of the bonding head 12 comes into contact with the placing surface of the stage 14, and time ts represents a timing at which the standby time ts has elapsed.

As described above, when the contact surface of the bonding head 12 comes into contact with the placing surface of the stage 14, the control unit 16 turns off the second heater HH. At this time, in an appropriate heating state in which the temperature of the contact surface of the bonding head 12 and the temperature of the placing surface of the stage 14 become substantially the same, it is conceivable that there is no heat inflow or outflow between the two, and the detection temperature T2 hardly changes (or decreases by the amount of heat flowing out to the outside air). That is, in this case, as shown by a solid line in FIG. 5, the second detection temperature T2 is maintained at a temperature that is substantially the same as or slightly lower than the head-side target temperature TH.

On the other hand, in the case of an overheating state in which the temperature of the placing surface of the stage 14 is higher than the temperature of the contact surface of the bonding head 12, it is conceivable that the heat of the stage 14 flows into the bonding head 12 and thus the second detection temperature T2 increases. That is, in this case, the second detection temperature T2 is expected to increase compared with the head-side target temperature TH (the initial temperature Tf) as shown by a one-dot chain line in FIG. 5. Then, it is expected that the temperature change amount $\Delta T$ obtained at time ts is a positive value and the absolute value thereof increases.

In addition, in the case of an insufficient heating state in which the temperature of the placing surface of the stage 14 is lower than the temperature of the contact surface of the bonding head 12, it is conceivable that the heat of the bonding head 12 flows into the stage 14 and thus the second detection temperature T2 decreases. That is, in this case, the second detection temperature T2 is expected to decrease compared with the head-side target temperature TH (the initial temperature Tf) as shown by a two-dot chain line in FIG. 5. Then, it is expected that the temperature change amount $\Delta T$ obtained at time ts is a negative value and the absolute value thereof increases.

Returning to FIG. 2 again, the flow of the temperature measurement processing is described. If the temperature change amount $\Delta T$ is obtained, the control unit 16 then compares the absolute value of the temperature change amount $\Delta T$ with a specified reference change amount $\Delta$def (S32). The reference change amount $\Delta$def is a change amount at which the contact surface of the bonding head 12 and the placing surface of the stage 14 (the object to be measured) are at substantially the same temperature, and the reference change amount $\Delta$def may be specified in advance by experiment or the like.

When the temperature change amount $\Delta T$ is equal to or less than the reference change amount $\Delta$def as a result of the comparison (Yes in S32), the control unit 16 determines that the temperature of the placing surface of the stage 14 is appropriate (S34), and ends the processing. On the other hand, when the temperature change amount $\Delta T$ exceeds the reference change amount $\Delta$def (No in S32), the control unit 16 determines that the temperature of the placing surface of the stage 14 is inappropriate (S36).

Besides, in steps S32 to S36, only whether the surface temperature is appropriate is determined based on the temperature change amount $\Delta T$, but a specific numerical value of the temperature of the placing surface of the stage 14 may also be acquired based on the temperature change amount $\Delta T$. For example, the temperature change amount $\Delta T$ is expected to depend to a certain degree on the temperature difference between the bonding head 12 and the stage 14 when the bonding head 12 comes into contact with the stage 14. Therefore, a map showing a correlation between the temperature difference of the bonding head 12 and the stage 14 at the time of the contact and the temperature change amount $\Delta T$ may be obtained in advance by experiment or the like, and the temperature change amount $\Delta T$ obtained in step S30 may be checked against the map to obtain the temperature difference of the bonding head 12 and the stage 14. Then, a value obtained by adding or subtracting the obtained temperature difference from the initial temperature Tf or the head-side target temperature TH may be calculated as the temperature of the placing surface of the stage 14.

The temperature measurement processing ends as described above, and if it is determined that the temperature of the placing surface of the stage 14 is inappropriate, the control unit 16 corrects a control parameter of the first heater HS so that the temperature change amount $\Delta T$ is reduced. Here, the control parameter to be corrected is not particularly limited as long as the parameter can change an output value (an output heat amount of the first heater HS) with respect to an input value (a target temperature of the surface of the stage 14) when the first heater HS is controlled. Accordingly, the control parameter to be corrected may be, for example, an offset current value that is added to or subtracted from a current applied to the first heater HS, a sensor offset value that is added or subtracted when a detection voltage value output from the first temperature sensor 22 is converted to the first detection temperature T1, the stage-side target temperature TS that is used when the temperature of the placing surface of the stage 14 is heated to the target temperature Tt, and the like.

In addition, the correction method is not particularly limited as long as the temperature change amount $\Delta T$ decreases. For example, when the temperature change amount $\Delta T$ is positive (when the surface temperature of the stage 14 is high), the offset current value may be decreased, the sensor offset value may be increased, or the stage-side target temperature TS may be decreased. Conversely, when the temperature change amount $\Delta T$ is negative (when the surface temperature of the stage 14 is low), the offset current value may be increased, the sensor offset value may be decreased, or the stage-side target temperature TS may be increased. In addition, the increase/decrease amount (the correction amount) of the control parameter may be a constant value or a variable value that changes corresponding to the value of the temperature change amount $\Delta T$. In any case, when the absolute value of the temperature change amount $\Delta T$ exceeds the reference change amount $\Delta$def, the placing surface of the stage 14 can be heated more accurately by correcting the control parameter corresponding to the value of the temperature change amount $\Delta T$.

As is clear from the above description, in the mounting apparatus 10 disclosed in the specification, when the surface temperature of the stage 14 is measured, not only the stage 14 that is an object to be measured but also the bonding head 12 functioning as a measurement head is heated close to the target temperature Tt. As a result, the temperature difference between the bonding head 12 and the stage 14 in the initial contact can be made relatively small, and the surface temperature of the stage 14 can be measured in a relatively short time.

Figure 6:
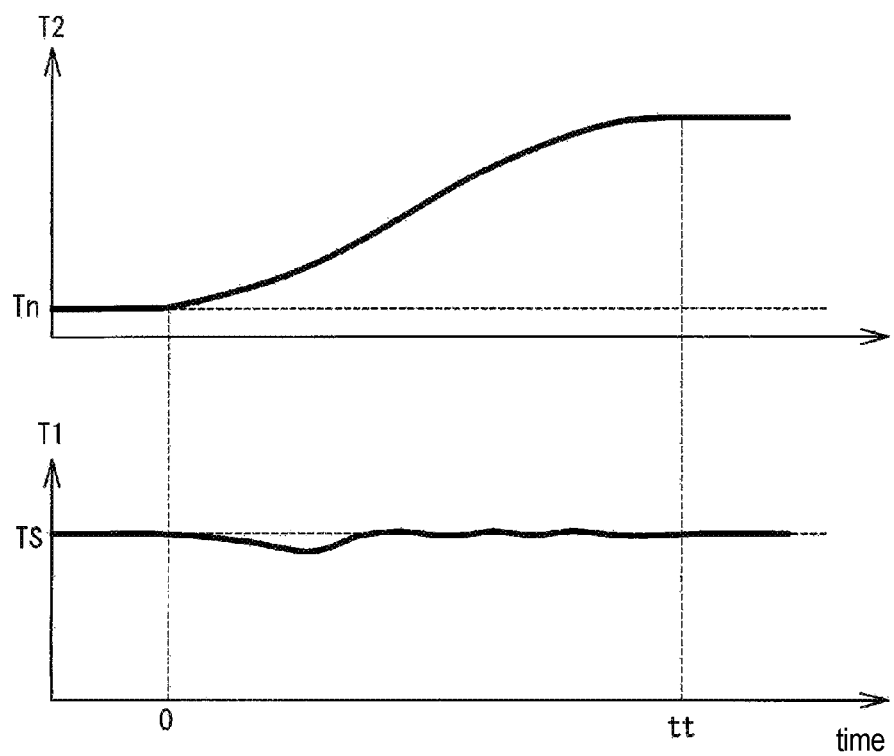
FIG. 6 is an image diagram showing changes over time in first and second detection temperatures when a bonding head is not heated.

The above situation is described in comparison with a case in which the bonding head 12 is not heated in advance. FIG. 6 is an image diagram showing a change between the first detection temperature T1 and the second detection temperature T2 when the bonding head 12 is not heated in advance. In FIG. 6, time 0 represents a timing at which the contact surface of the bonding head 12 comes into contact with the placing surface of the stage 14. In addition, Tn represents room temperature.

In this case, before the contact surface of the bonding head 12 comes into contact with the placing surface of the stage 14, the control unit 16 controls the first heater HS so that the first detection temperature T1 becomes the stage-side target temperature TS. If the contact surface of the bonding head 12 at the room temperature Tn comes into contact with the placing surface of the stage 14 in this state, the heat of the stage 14 flows out to the bonding head 12 and thus the temperature of the stage 14 (consequently, the first detection temperature T1) is reduced accordingly. In this case, the control unit 16 increases the energization amount to the first heater HS so as to compensate for the temperature reduction of the first detection temperature T1. As a result, when a certain time has elapsed, the first detection temperature T1 increases again and gets close to the stage-side target temperature TS. However, even after that, the heat inflow and outflow are generated until the contact surface of the bonding head 12 reaches the same temperature as the placing surface of the stage 14, and thus the temperature of the first detection temperature T1 is not stable and fluctuates easily.

On the other hand, the second detection temperature T2 gradually increases after the contact surface of the bonding head 12 is in contact with the placing surface of the stage 14. Then, the second detection temperature T2 is stabilized at a prescribed temperature if a sufficient time tt has elapsed. Besides, the time tt until the second detection temperature T2 is stabilized is sufficiently longer than the standby time ts.

In other words, when the bonding head 12 is not heated in advance, the temperature difference between the bonding head 12 and the stage 14 in the initial contact is large, and the inflow and outflow amount of heat between the bonding head 12 and the stage 14 increases. As a result, a large temperature fluctuation is generated in both the bonding head 12 and the stage 14, and thus there is a problem that the measurement precision of the temperature of the placing surface of the stage 14 is reduced or the measurement time is prolonged.

On the other hand, in the mounting apparatus 10 disclosed in the specification, as described above, the contact surface of the bonding head 12 is heated close to the target temperature Tt in advance. Therefore, the inflow and outflow amount of heat between the bonding head 12 and the stage 14 can be kept small, and the temperature of the placing surface of the stage 14 can be measured more accurately in a shorter time.

In addition, in the mounting apparatus 10 disclosed in the specification, the bonding head 12 is used as a measurement head. As a result, it is not necessary to add a new member for measurement, and the contact surface of the bonding head 12 (the measurement head) and the placing surface of the stage 14 can be accurately brought into contact. That is, in order to appropriately bond the semiconductor chip 110, the bonding head 12 is required to uniformly pressurize the entire surface of the semiconductor chip 110. In order to satisfy this requirement, the parallelism of the bonding head 12 with respect to the stage 14 is adjusted with high precision. As a result, during the temperature measurement, the contact surface of the bonding head 12 can directly come into contact with the placing surface of the stage 14, and thus the thermal resistance between the bonding head 12 and the stage 14 when the two are in contact with each other can be kept small. As a result, the temperature of the placing surface of the stage 14 can be measured more accurately.

In addition, in the mounting apparatus 10 disclosed in the specification, the second detection temperature T2 is not acquired as the surface temperature of the stage 14, and whether the surface temperature of the stage 14 is appropriate or the specific value of the surface temperature of the stage 14 is determined based on the value (the temperature change amount $\Delta T$) indicating the change over time in the second detection temperature T2. In this case, the time required for the temperature measurement processing of the stage 14 can be further shortened. That is, when the second detection temperature T2 is acquired as the surface temperature of the stage 14, it is naturally necessary to stand by until the second detection temperature T2 is stabilized. However, if there is a temperature difference between the bonding head 12 and the stage 14, it takes time until the second detection temperature T2 is stabilized, and consequently the measurement time is prolonged. On the other hand, if the temperature change amount $\Delta T$ is utilized, it is not necessary to wait for the second detection temperature T2 to be stabilized, and the surface temperature of the stage 14 can be measured in a relatively short time. Besides, in the above description, the temperature measurement is performed based on the temperature change amount $\Delta T$, but the value is not limited to the temperature change amount $\Delta T$, and other values may also be used as long as this value indicates the change over time in the second detection temperature T2. For example, the temperature measurement may be performed based on the slope ($\approx \Delta T/ts$) of a curve of change over time of the second detection temperature T2.

Figure 7:
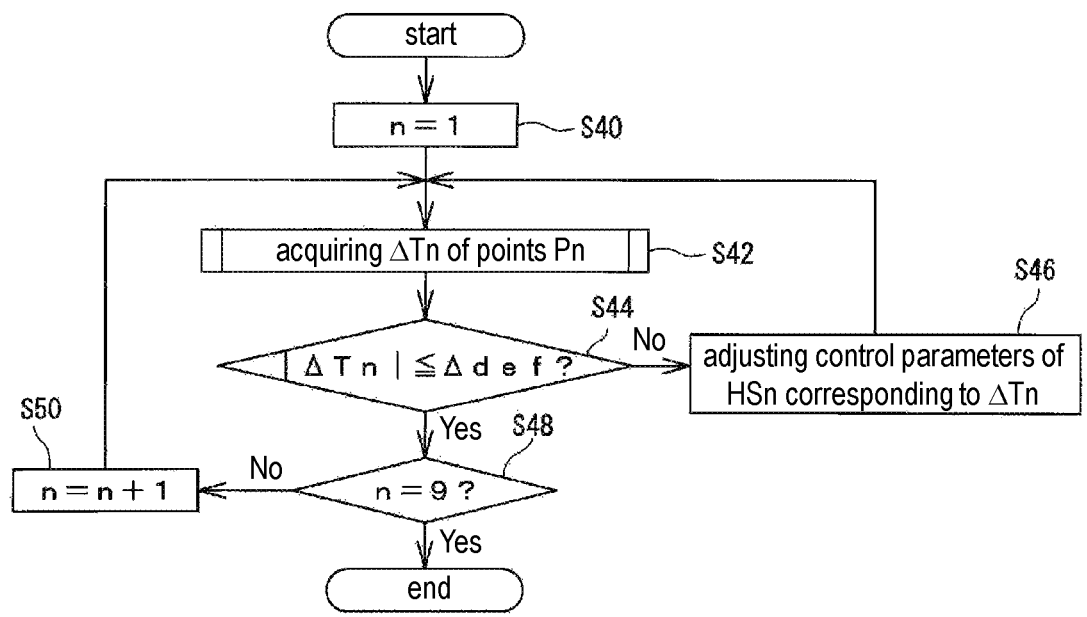
FIG. 7 is a flowchart showing a flow of temperature adjustment processing in which the temperature measurement processing is incorporated.
Figure 8:
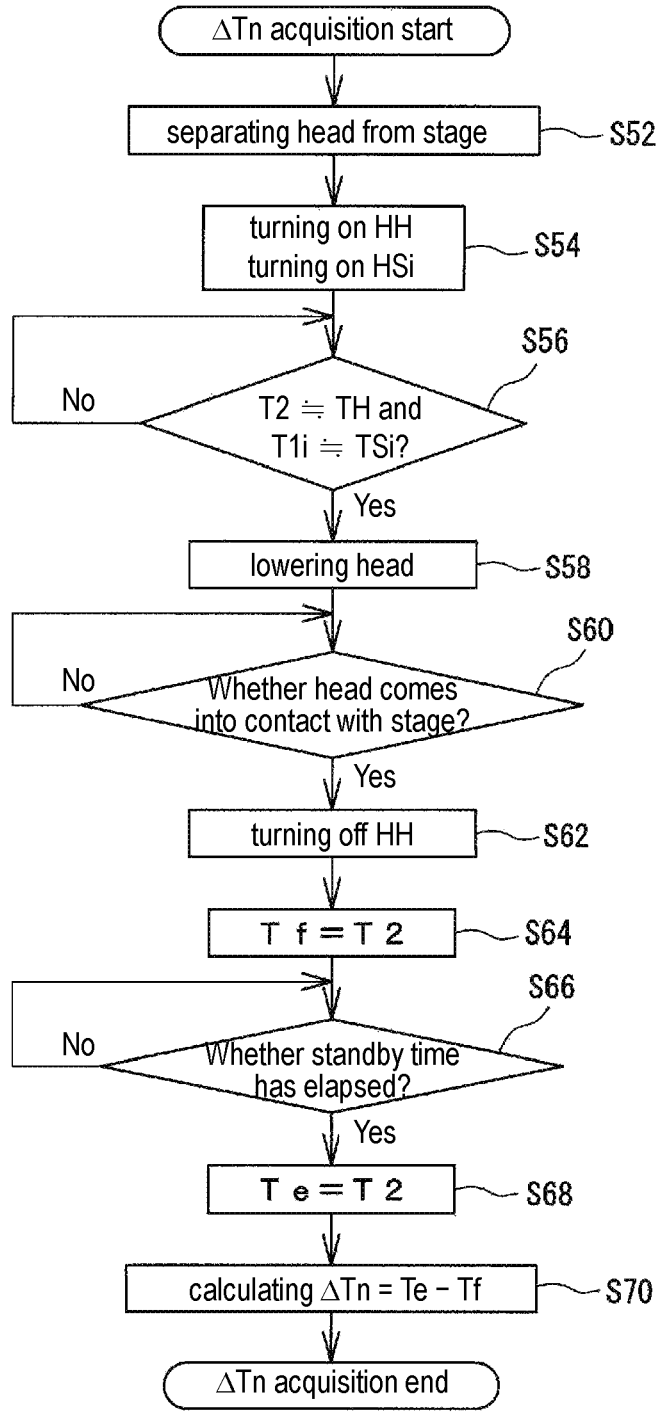
FIG. 8 is a flowchart showing a flow of ΔTn acquisition.
Figure 9:
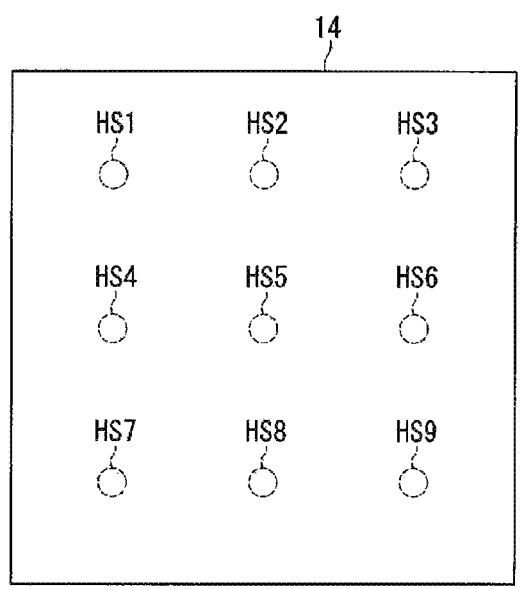
FIG. 9 is a diagram showing an example of an arrangement of a first heater.

Next, temperature adjustment processing is described in which the temperature measurement processing described above is utilized to adjust the parameters of a plurality of first heaters HSn. FIGS. 7 and 8 are flowcharts showing a flow of the temperature adjustment processing. FIG. 9 is a diagram showing an arrangement of the first heater HSn in the stage 14.

As shown in FIG. 9, in this case, the stage 14 has nine first heaters HSn (n=1, 2, . . . , 9) disposed in three rows and three columns. A first temperature sensor 22$n$ that detects the temperature of the first heater HSn is incorporated in each first heater HSn. In the temperature adjustment processing, the temperature of the position directly above each of the nine first heaters HSn within the placing surface of the stage 14 is measured, and the control parameter of the first heater HSn is changed corresponding to the measurement result. Hereinafter, the position at which this temperature is measured, that is, the position directly above each of the first heaters HSn is referred to as "measurement point Pn".

When the temperature adjustment processing is performed, as shown in FIG. 7, first, n is set to 1 (S40), and then the temperature change amount $\Delta Tn$ at the measurement point Pn (=P1) is acquired (S42). The processing flow for acquiring $\Delta Tn$ is as shown in FIG. 8, and the content is similar to the processing described with reference to FIG. 2. That is, the control unit 16 turns on the second heater HH and all the first heaters HSi (i=1, 2, . . . , 9) in a state that the bonding head 12 is separated from the stage 14 (S52, S54). In this state, the control unit 16 monitors whether the second detection temperature T2 detected by the second temperature sensor 20 reaches the head-side target temperature TH and whether a first detection temperature T1$i$ detected by each first temperature sensor 22$i$ reaches a corresponding stage-side target temperature TSi (S56).

If T2=TH and T1$i$=TSi, the controller 16 lowers the bonding head 12 (S58). If the contact surface of the bonding head 12 comes into contact with the placing surface of the stage 14 as a result of the lowering (Yes in S60), the control unit 16 turns off the second heater HH (S62). Then, the control unit 16 stores the second detected temperature T2 detected by the second temperature sensor 20 immediately after the contact as the initial temperature Tf (S64).

After that, if the prescribed standby time ts has elapsed (Yes in S66), the control unit 16 stores the second detected temperature T2 at that time as the end temperature Te (S68). Then, a value obtained by subtracting the initial temperature Tf from the end temperature Te is calculated as the temperature change amount ΔTn (S70).

FIG. 7 is again referred to for description. If the temperature change amount ΔTn is obtained, the control unit 16 subsequently determines whether the absolute value of the temperature change amount ΔTn is equal to or less than the specified reference change amount Δdef (S44). When the result of the determination is |ΔTn|>Δdef (No in S44), the control unit 16 changes the control parameter of the first heater HSn corresponding to the obtained temperature change amount ΔTn (S46). Then, steps S42, S44 are executed again, and determination is made on whether to change the control parameter. On the other hand, when |ΔTn|≤Δdef (Yes in S44), the control unit 16 determines whether n is 9 (S48); when n≠9, n is incremented (S50), then step 42 is performed again, and determination is made on whether to change the parameters for other measurement points Pn. On the other hand, when n=9, it is determined that the temperature adjustment has been completed for all the measurement points Pn, and the processing ends.

As is clear from the above description, according to the processing shown in FIGS. 7 and 8, the temperature is measured for each of the plurality of measurement points Pn, and the control parameters of the plurality of first heaters HSn are adjusted corresponding to the measurement results. As a result, variations in the temperature of the placing surface of the stage 14 can be reduced, and more appropriate bonding is possible.

Figure 10:
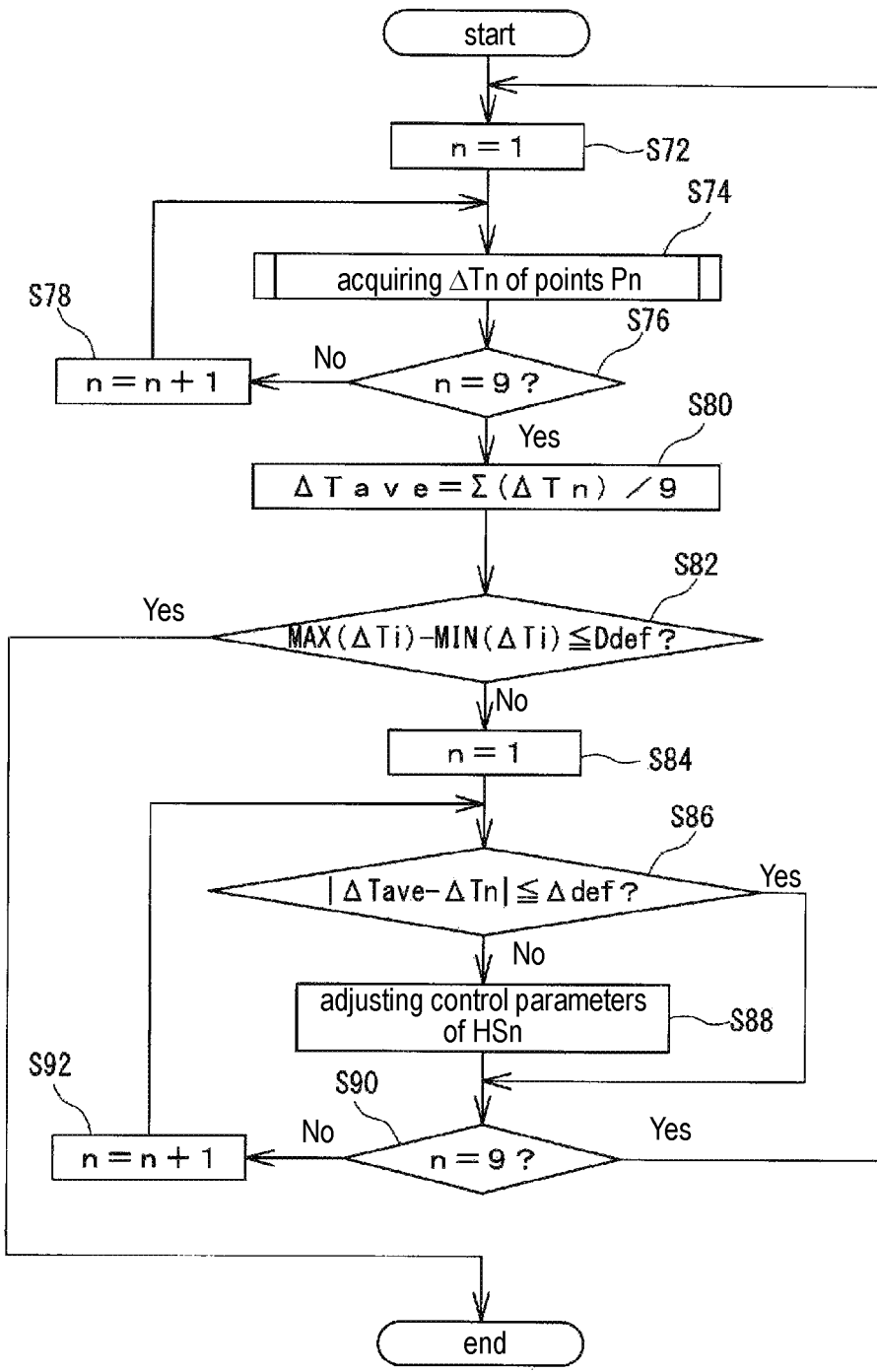
FIG. 10 is a flowchart showing a flow of another temperature adjustment processing.

Besides, in FIG. 7, the control parameter is adjusted so that the temperature change amount ΔTn of each measurement point Pn is equal to or less than the reference change amount Δdef. However, the control parameter may also be adjusted so that variations in the temperature among the plurality of measurement points Pn are reduced. FIG. 10 is a flowchart showing a flow of the temperature adjustment processing for reducing the variations in the temperature among the plurality of measurement points Pn.

In the processing shown in FIG. 10, the control unit 16 first acquires the temperature change amounts ΔTn of the plurality of measurement points Pn (S72 to S78). At this time, the flow of the acquisition processing of the temperature change amount ΔTn is the same as in FIG. 8.

If the temperature change amounts ΔTn of all the measurement points Pn are obtained (Yes in S76), the control unit 16 calculates an average change amount ΔTave=Σ(ΔTn)/9 that is the average value of the temperature change amounts ΔTn (S80). Subsequently, the control unit 16 determines whether the difference between the maximum value MAX (ΔTi) and the minimum value MIN (ΔTi) within the obtained plurality of temperature change amounts ΔTi is equal to or less than a prescribed reference value Ddef (S82). Here, the reference value Ddef is a value at which the plurality of measurement points Pn can be regarded as substantially the same temperature, and is a value obtained in advance by experiment or the like.

If MAX (ΔTi–MIN (ΔTi)≤Ddef (Yes in S82), the control unit 16 determines that the temperatures of the plurality of measurement points Pn are substantially equal, and ends the processing. On the other hand, if it is not that MAX (ΔTi)–MIN (ΔTi)≤Ddef (No in S82), the control unit 16 compares the absolute value of the difference value between the average change amount ΔTave and the temperature change amount ΔTn with the reference change amount Δdef for each measurement point Pn (S86). When the absolute value of the difference value is larger than the reference change amount Δdef (No in S86), the control parameter of the corresponding first heater HSn is adjusted so that the absolute value of the difference value is reduced (S88). If the above processing is performed for all the measurement points Pn (n=1-9 (S84, S90) in the shown example) (Yes in S90), step S72 is performed again and the same processing is repeated until the condition in step S82 is satisfied.

As is clear from the above description, in the temperature adjustment processing of FIG. 10, the control parameter of each first heater HSn is adjusted so that the temperature change amount ΔT is close to the average change amount ΔTave. The variations in the temperature among the measurement points Pn are more effectively eliminated by adjusting the parameters on the basis of the average change amount ΔTave.

Besides, in the above description, and the parameters are adjusted using the average change amount ΔTave as a reference value so that the temperature change amount ΔTn is close to the average change amount ΔTave, but the parameter serving as the reference value may also be a parameter other than the average change amount ΔTave. For example, a thermocouple is attached in advance to one measurement point P* within the plurality of measurement points Pn, and the control parameter of the corresponding first heater HSn is adjusted so that the measurement value obtained by the thermocouple becomes a desired value. Besides, the parameter may be adjusted so that the temperature change amounts ΔTn of the other measurement points are close to a temperature change amount ΔT* obtained at the measurement point P*.

In addition, the configurations described above are all examples, and other configurations may be appropriately changed, as long as the measurement head and the stage 14 have the heaters HH, HS and when the heater HH of the measurement head is turned off after being heated to approximately the same temperature as the surface of the object to be measured, the surface temperature of the object to be measured is measured based on the detection temperature obtained by the temperature sensor arranged on the measurement head. For example, in the above description, the temperature sensor for measuring the surface temperature of the object to be measured is arranged inside the bonding head 12, but the temperature sensor may also be arranged in a member which has a heat capacity sufficiently smaller than the bonding head 12.

Figure 11:
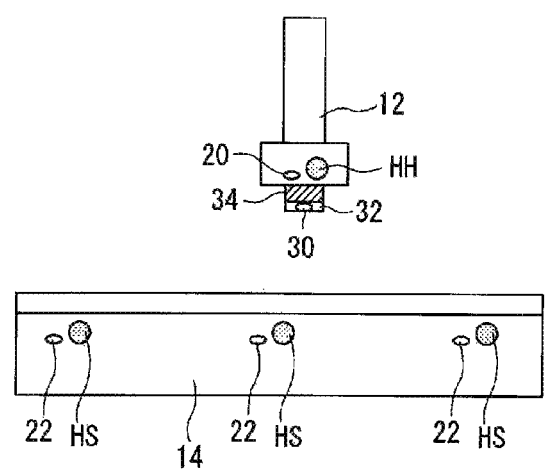
FIG. 11 is a diagram showing an example of another mounting apparatus.

For example, as shown in FIG. 11, a measurement block 32 having a small heat capacity may be attached to the lower end of the main body of the bonding head 12 via a heat insulating material 34, and a temperature sensor 30 consisting of a thermocouple or the like may be arranged in the measurement block 32. Then, when the temperature of the object to be measured is measured, the front end surface of the measurement block 32 may be brought into contact with the object to be measured. In this configuration, since the temperature sensor 30 is arranged in the measurement block 32 having a smaller heat capacity than the main body of the bonding head 12, heat movement after the contact with the object to be measured is not prone to occur. As a result, the temperature of the object to be measured can be measured more accurately. In addition, the area of the part in contact with the object to be measured is reduced, and thereby a finer temperature distribution can be measured. In addition, in the above description, the bonding head 12 is used as a measurement head, but a head dedicated to temperature measurement may be arranged separately from the bonding head 12. In addition, in the above description, as an object to be measured, the temperature of the placing surface of the stage 14 is measured, but the temperature of the mounted body (for example, the substrate 100 or the like) placed on the placing surface of the stage 14 may also be measured.

Furthermore, in the embodiments, it is described that the mounting body mounted on the mounted body is a semiconductor chip, but the present invention can be applied without being limited to the apparatus for mounting the semiconductor chip on the mounted body. For example, the present invention can also be applied to a apparatus that joins a piece-like object such as glass, metal or resin to a mounted body, and a apparatus that electrically joins an electronic component such as a transistor, a capacitor or an IC to a mounting substrate.

REFERENCE SIGNS LIST 10 mounting apparatus
12 bonding head
14 stage
16 control unit
20 second temperature sensor
22 first temperature sensor
30 temperature sensor
32 measurement block
34 heat insulating material
100 substrate
110 semiconductor chip

What is claimed is:

1. A mounting apparatus, which mounts a mounting body on a mounted body, comprising:
    a stage having a placing surface on which the mounted body is placed and a first heater that heats the placing surface;
    a measurement head which has a contact surface in contact with an object to be measured, wherein the object to be measured is the mounted body or the placing surface, a measurement element that measures a temperature of the object to be measured via the contact surface, and a second heater that heats the contact surface, and which is driven in at least a direction orthogonal to the placing surface; and
    a control unit which measures the temperature of the object to be measured based on a temperature detection value of the measurement element, wherein the temperature detection value is obtained by respectively heating the placing surface and the contact surface to predetermined target temperatures by means of the first heater and the second heater, and then bringing the contact surface into contact with the object to be measured in a state that heating by the second heater is stopped,
    wherein the control unit changes a control parameter of the first heater to reduce a temperature change amount to be smaller than a reference change amount, and the temperature change amount is obtained from the measure element when the contact surface being in contact with the object to be measured.

2. The mounting apparatus according to claim 1, wherein the measurement head is a bonding head which bonds the mounting body to the mounted body.

3. The mounting apparatus according to claim 1, wherein the control unit determines the temperature of the object to be measured or whether the temperature of the object to be measured is appropriate based on a change over time in the temperature detection value of the measurement element obtained when the contact surface is brought into contact with the object to be measured.

4. The mounting apparatus according to claim 1, wherein the control unit corrects a control parameter of the first heater based on a measurement result of the temperature of the object to be measured.

5. The mounting apparatus according to claim 4, wherein a plurality of measurement points is set on the object to be measured, and
    the control unit performs the temperature measurement for the plurality of measurement points, and corrects the control parameter so that the measurement results are equal among the plurality of measurement points.

6. The mounting apparatus according to claim 1, wherein the measurement head further comprises a main body, and a measurement block having a smaller heat capacity than the main body and attached to the measurement head via a heat insulating material;
    the contact surface is an end surface of the measurement block; and
    the measurement element is arranged inside the measurement block.

7. The mounting apparatus according to claim 2, wherein the control unit determines the temperature of the object to be measured or whether the temperature of the object to be measured is appropriate based on a change over time in the temperature detection value of the measurement element obtained when the contact surface is brought into contact with the object to be measured.

8. The mounting apparatus according to claim 2, wherein the control unit corrects a control parameter of the first heater based on a measurement result of the temperature of the object to be measured.

9. The mounting apparatus according to claim 3, wherein the control unit corrects a control parameter of the first heater based on a measurement result of the temperature of the object to be measured.

10. The mounting apparatus according to claim 2, wherein the measurement head further comprises a main body, and a measurement block having a smaller heat capacity than the main body and attached to the measurement head via a heat insulating material;
    the contact surface is an end surface of the measurement block; and
    the measurement element is arranged inside the measurement block.

11. The mounting apparatus according to claim 3, wherein the measurement head further comprises a main body, and a measurement block having a smaller heat capacity than the main body and attached to the measurement head via a heat insulating material;
    the contact surface is an end surface of the measurement block; and
    the measurement element is arranged inside the measurement block.

12. The mounting apparatus according to claim 4, wherein the measurement head further comprises a main body, and a measurement block having a smaller heat capacity than the main body and attached to the measurement head via a heat insulating material;
    the contact surface is an end surface of the measurement block; and
    the measurement element is arranged inside the measurement block.

13. The mounting apparatus according to claim 5,
wherein the measurement head further comprises a main body, and a measurement block having a smaller heat capacity than the main body and attached to the measurement head via a heat insulating material;
the contact surface is an end surface of the measurement block; and
the measurement element is arranged inside the measurement block.

14. A temperature measurement method, for measuring the temperature of an object to be measured which is a mounted body placed on a placing surface of a stage of a mounting apparatus or the placing surface of the stage by means of a measurement head, the method comprising:
a step for heating the placing surface and a contact surface of the measurement head in contact with the object to be measured to specified target temperatures by means of a first heater arranged inside the stage and a second heater arranged on the measurement head;
a step for bringing the contact surface into contact with the object to be measured in a state that the second heater is stopped after the heating;
a step for changing a control parameter of the first heater to reduce a temperature change amount to be smaller than a reference change amount, and the temperature change amount is obtained from a temperature measure element arranged on the measurement head when the contact surface being in contact with the object to be measured; and
a step for measuring the temperature of the object to be measured based on a temperature detection value obtained by the temperature measurement element arranged on the measurement head during the contact.

* * * * *